United States Patent
Torigoe

(10) Patent No.: US 10,614,896 B2
(45) Date of Patent: Apr. 7, 2020

(54) NON-VOLATILE MEMORY DEVICE AND INTERFACE CONFIGURATION METHOD

(71) Applicant: HITACHI, LTD., Tokyo (JP)

(72) Inventor: Seiji Torigoe, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 16/295,366

(22) Filed: Mar. 7, 2019

(65) Prior Publication Data

US 2019/0378578 A1    Dec. 12, 2019

(30) Foreign Application Priority Data

Jun. 12, 2018  (JP) .................. 2018-111929

(51) Int. Cl.
  *G11C 16/34* (2006.01)
  *G11C 7/10* (2006.01)
  *G06F 3/06* (2006.01)

(52) U.S. Cl.
  CPC ............ *G11C 16/34* (2013.01); *G06F 3/0605* (2013.01); *G06F 3/067* (2013.01); *G06F 3/0658* (2013.01); *G11C 7/1048* (2013.01)

(58) Field of Classification Search
  CPC ............................ G11C 16/10; G11C 16/26
  USPC ....................... 365/185.18, 185.24
  See application file for complete search history.

(56) References Cited

U.S. PATENT DOCUMENTS

| | | | | |
|---|---|---|---|---|
| 5,592,646 A * | 1/1997 | Thomas | ................ | G06F 3/0601 365/145 |
| 7,386,696 B2 * | 6/2008 | Jakobs | ................ | G11C 5/063 711/100 |
| 8,281,062 B2 * | 10/2012 | Hahn | ................ | G06F 3/0613 710/13 |
| 8,716,876 B1 * | 5/2014 | Smolen | ................ | H01L 25/50 257/798 |
| 10,027,381 B2 * | 7/2018 | Iwakura | ................ | H04B 5/0093 |
| 10,373,654 B1 * | 8/2019 | Vankayala | ........... | G11C 7/1057 |
| 10,504,571 B1 * | 12/2019 | Johnson | ................ | G11C 7/109 |
| 2004/0205274 A1 * | 10/2004 | Poisner | ............... | G06F 13/4243 710/305 |
| 2005/0185463 A1 * | 8/2005 | Kanamori | ............. | G11C 16/20 365/185.04 |
| 2007/0041454 A1 | 2/2007 | Yamazaki | | |
| 2008/0189452 A1 * | 8/2008 | Merry | ................. | G06F 3/061 710/56 |

(Continued)

FOREIGN PATENT DOCUMENTS

JP  2011-041109 A  2/2011

*Primary Examiner* — Michael T Tran

(74) *Attorney, Agent, or Firm* — Volpe and Koenig, P.C.

(57) ABSTRACT

An FMD including a plurality of FM chips and an FM-CTL equipped with a flash I/F for executing I/O processes to and from the FM chips, wherein the FM-CTL is provided with a flash I/F in correspondence with each of a plurality of channels, and the FM-CTL is configured to: acquire a higher-level operating frequency between a DKC and the FM-CTL; determine an operating frequency of the flash I/F such that a total transfer rate to and from the FM chips produced by the flash I/Fs of the respective channels should be a transfer rate that equals a higher-level transfer rate corresponding to the higher-level operating frequency or a transfer rate that approximates the higher-level transfer rate; and perform a configuration of an operating frequency determined with respect to each of the flash I/Fs.

10 Claims, 17 Drawing Sheets

(56) References Cited

U.S. PATENT DOCUMENTS

| | | | |
|---|---|---|---|
| 2011/0029723 A1* | 2/2011 | Lee | G06K 19/07732 |
| | | | 711/103 |
| 2011/0038426 A1 | 2/2011 | Koba et al. | |
| 2011/0085385 A1* | 4/2011 | Park | G11C 11/5621 |
| | | | 365/185.22 |
| 2011/0185145 A1* | 7/2011 | Moro | G06F 13/1605 |
| | | | 711/167 |
| 2014/0229655 A1* | 8/2014 | Goss | G06F 11/1048 |
| | | | 711/103 |
| 2015/0095565 A1* | 4/2015 | Morris | G11C 11/4096 |
| | | | 711/109 |
| 2015/0221370 A1* | 8/2015 | Kim | G11C 29/52 |
| | | | 711/103 |
| 2016/0291883 A1* | 10/2016 | Manohar | G06F 3/0613 |
| 2016/0344834 A1* | 11/2016 | Das | G06F 11/3476 |
| 2017/0097782 A1* | 4/2017 | Ramalingam | G06F 3/0616 |
| 2017/0177217 A1* | 6/2017 | Kanno | G06F 12/0246 |
| 2017/0177218 A1* | 6/2017 | Kanno | G06F 3/0688 |
| 2017/0201243 A1* | 7/2017 | Hu | H03K 5/15 |
| 2018/0173465 A1* | 6/2018 | Tanaka | G06F 3/0488 |
| 2018/0261282 A1* | 9/2018 | Oh | G11C 7/1021 |
| 2018/0373590 A1* | 12/2018 | Higgins | G06F 11/1048 |
| 2019/0056999 A1* | 2/2019 | Foxworth | G06F 11/1456 |
| 2019/0065116 A1* | 2/2019 | Sekine | G06F 3/0659 |
| 2019/0286560 A1* | 9/2019 | Shallal | G06F 11/14 |
| 2019/0361778 A1* | 11/2019 | Kim | G11B 20/10388 |

* cited by examiner

FIG.5

| Condition | Contents | Reference (previous value) | Error | |
|---|---|---|---|---|
| Temperature change of FM-CTL | FM-CTL temperature is inconsistent with previous value | 70° C | ±0.5° C | 611 |
| Temperature change of intake temperature | Intake temperature is inconsistent with previous value | 25° C | ±0.5° C | 612 |
| Temperature change of exhaust temperature | Exhaust temperature is inconsistent with previous value | 50° C | ±0.5° C | 613 |
| Voltage change of flash I/F | Read voltage of flash I/F is inconsistent with previous value | 1.80 V | ±0.02 V | 614 |
| Temperature change of FM chips | Average temperature of FM chips is inconsistent with previous value | 30° C | ±0.5° C | 615 |
| I/O error | I/O errors to/from FM chip have occurred | 5 times/hour | — | 616 |
| Start time of FMD | Elapsed time from previous parameter update process | 30 minutes | — | 617 |
| Initial start of FMD | First time after power supply is turned ON | 1st time | — | 618 |

NON-VOLATILE MEMORY DEVICE AND INTERFACE CONFIGURATION METHOD

CROSS-REFERENCE TO PRIOR APPLICATION

This application relates to and claims the benefit of priority from Japanese Patent Application No. 2018-111929 filed on Jun. 12, 2018, the entire disclosure of which is incorporated herein by reference.

BACKGROUND

The present invention relates to a non-volatile memory device and the like which includes a plurality of non-volatile memory chips and a non-volatile memory controller equipped with an interface for executing I/O processes of data to and from the non-volatile memory chips.

Conventionally, non-volatile memory devices including a plurality of non-volatile memory chips have been known. A NAND-type flash memory chip has been known as an example of a non-volatile memory chip.

NAND-type flash memory chips are available as a wide variety of products and flash memory chips of different types may conceivably be mounted to a non-volatile memory device. When such a configuration is envisaged, various parameters in interfaces (flash I/Fs) respectively provided in a flash memory controller which controls I/O processes to and from the flash memory chips inside the non-volatile memory device and in the flash memory chips must be optimized for each type of the flash memory chips.

When optimizing the various parameters in a flash I/F, for example, a transmission waveform produced by the flash I/F may conceivably be evaluated with an oscilloscope to retrieve optimal parameters.

For example, as a method of optimizing parameters of an I/F for performing transmission between LSIs, a technique has been known, which involves preparing a table of power-supply voltage and a configuration parameter for each of a plurality of operating frequency bands and selecting a configuration parameter from the table (for example, refer to Japanese Patent Application Publication No. 2011-41109).

SUMMARY

For example, optimizing parameters by evaluating a transmission waveform produced by a flash I/F with an oscilloscope requires many man-hours.

In addition, even when used flash memory chips are chips of a same type, a wiring length and/or a coupling relationship between the flash memory chips and a flash memory controller may differ depending on individual variability, mounting positions, and the like of the flash memory chips and, consequently, the same parameters are not necessarily always optimal. Therefore, even in such cases, the parameters in a flash I/F must be optimized.

Furthermore, the optimal values of parameters in a flash I/F may also vary depending on a state of use and the like of the non-volatile memory device and, therefore, parameters must be optimized even in such cases.

The present invention has been made in consideration of the circumstances described above, and an object of the present invention is to provide a technique that enables parameters in an interface used for I/O processes between a non-volatile memory controller and a non-volatile memory chip to be configured in an easy and appropriate manner.

In order to achieve the object described above, a non-volatile memory device according to an aspect is a non-volatile memory device including a plurality of non-volatile memory chips and a non-volatile memory controller equipped with an interface for executing I/O processes of data to and from the non-volatile memory chips, wherein the non-volatile memory controller is coupled to the plurality of non-volatile memory chips via a plurality of channels and the interface is provided in correspondence to each of the plurality of the channels, and the non-volatile memory controller is configured to: acquire higher-level transfer rate information related to a data transfer rate between a higher-level apparatus and the non-volatile memory controller; determine transfer rate information related to a transfer rate of the interfaces such that a total transfer rate which is a sum of transfer rates to and from the non-volatile memory chips produced by the respective interfaces corresponding to the plurality of channels should be a transfer rate that equals a higher-level transfer rate corresponding to the higher-level transfer rate information or a transfer rate that approximates the higher-level transfer rate; and perform a configuration related to a transfer rate on the basis of the determined transfer rate information with respect to each of the interfaces.

According to the present invention, parameters in an interface used for I/O processes between a non-volatile memory controller and a non-volatile memory chip can be configured in an easy and appropriate manner.

BRIEF DESCRIPTION OF THE DRAWINGS

FIG. 5 is a configuration diagram of an update condition table according to the embodiment;

DETAILED DESCRIPTION OF THE EMBODIMENT

An embodiment will be described with reference to the drawings. It should be noted that the embodiment described below is not intended to limit the invention as set forth in the accompanying claims and that all of the elements and combinations thereof described in the embodiment are not necessarily essential to solutions proposed by the invention.

Although information will be described below using expressions such as an "AAA table", information may be expressed using any kind of data structure. In other words, an "AAA table" can also be referred to as "AAA information" in order to show that information is not dependent on data structure.

In addition, in the following description, "RAID" is an abbreviation of Redundant Array of Independent (or Inexpensive) Disks.

Figure 1:
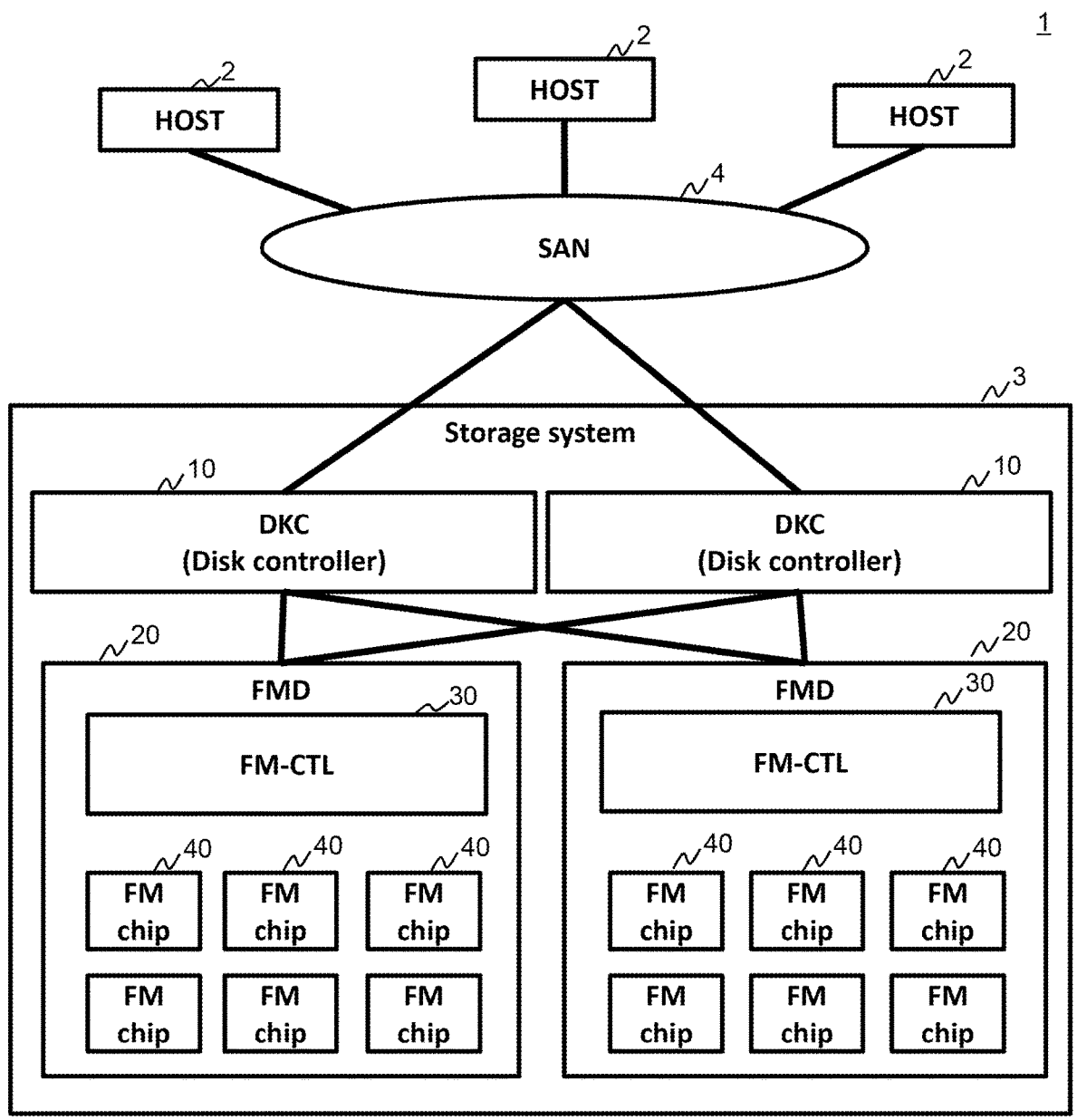
FIG. 1 is an overall configuration diagram of a computer system according to an embodiment.

FIG. 1 is an overall configuration diagram of a computer system according to the embodiment.

A computer system 1 includes one or more hosts 2, one or more storage systems 3, and a SAN (Storage Area Network) 4 which couples the hosts 2 and the storage systems 3 to each other. The SAN 4 may be replaced with a communication network of another type.

The host 2 transmits, to the storage system 3, I/O (input/output) requests with respect to the storage system 3 or, more specifically, a read request to read data stored in the storage system 3 and a write request to write data to the storage system 3.

The storage system 3 includes one or more disk controllers (DKCs) 10 as examples of a higher-level apparatus and one or more FMDs (flash memory devices) 20.

The FMD 20 is a storage device (a non-volatile memory device) which stores data written from the host 2 and the like and which adopts a non-volatile memory such as a flash memory as a storage medium.

The FMD 20 includes a plurality of FM chips (flash memory chips: non-volatile memory chips) 40 and an FM-CTL (a flash memory controller: a non-volatile memory controller) 30. A detailed configuration of the FMD 20 will be described later. The FMD 20 is coupled to the disk controller 10 by, for example, a transmission line (an SAS link) conforming to the SAS (Serial Attached SCSI) standard or a transmission line (a PCI link) conforming to the PCI (Peripheral Component Interconnect) standard.

The disk controller 10 receives an I/O request from the host 2 and, in accordance with the I/O request, executes an I/O process (a read process of reading data from the FMD 20 or a write process of writing data to the FMD 20). It should be noted that the disk controller 10 may be configured to manage a RAID group (a parity group) constituted by a plurality of FMDs 20 and execute a read process or a write process with respect to the RAID group in accordance with a RAID level associated with the RAID group.

Next, the FMD 20 will be described in detail.

Figure 2:
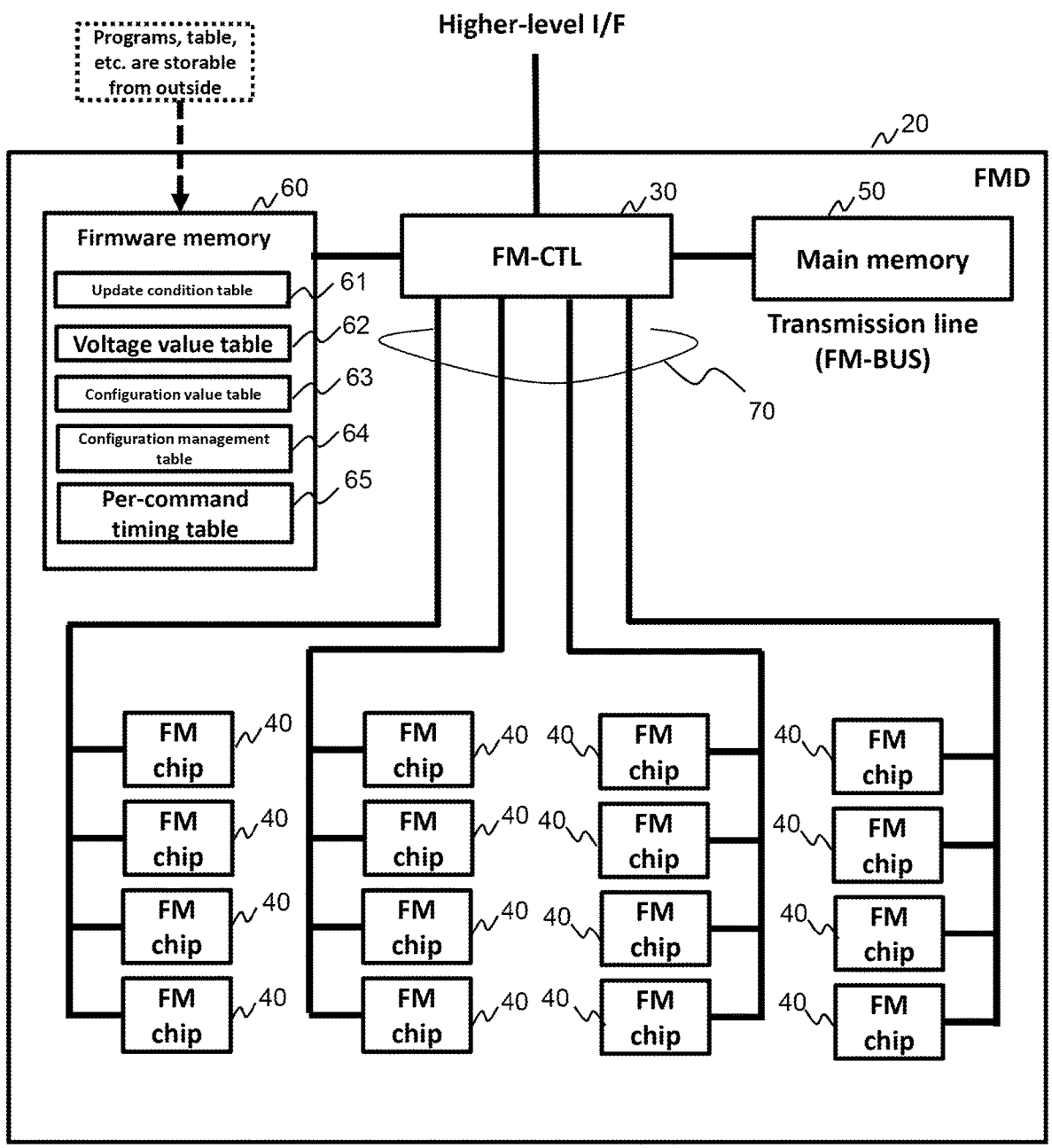
FIG. 2 is a configuration diagram of a flash memory device according to the embodiment.

FIG. 2 is a configuration diagram of a flash memory device according to the embodiment.

The FMD 20 includes the FM-CTL 30, the plurality of FM chips 40, a main memory 50, and a firmware memory 60. The FM-CTL 30 is coupled to the main memory 50 and the firmware memory 60. In addition, the FM-CTL 30 is coupled to the plurality of FM chips 40 via a transmission line (a bus: FM-BUS) 70. In the present embodiment, the transmission line 70 has a plurality of channels (in FIG. 2, for example, four channels), and a plurality of FM chips 40 are coupled to each channel. Each channel is capable of independently performing data transfer.

The FM-CTL 30 executes various processes by executing a program stored in the main memory 50. For example, the FM-CTL 30 controls I/O processes of data to and from the FM chips 40. In addition, the FM-CTL 30 executes a parameter update process of updating parameters of interfaces (flash I/Fs 32 and 42) which execute communication between the FM-CTL 30 and the FM chips 40, and the like.

The FM chip 40 is, for example, a non-volatile semiconductor memory chip such as a NAND-type flash memory. Examples of the FM chip 40 include a QLC FM chip, a TLC FM chip, and an SLC (Single Level Cell) FM chip.

The main memory 50 may be constituted by a volatile storage medium such as a DRAM or an SRAM or by a non-volatile memory. The main memory 50 stores programs executed by the FM-CTL 30 and necessary information.

The firmware memory 60 is, for example, a non-volatile memory such as a flash memory and stores programs executed by the FM-CTL 30, various tables, and the like. Programs, tables, and the like can be stored in the firmware memory 60 from an apparatus outside of the FMD 20 (via the FM-CTL 30 or without involving the FM-CTL 30).

The firmware memory 60 stores an update condition table 61, a voltage value table 62, a configuration value table 63, a configuration management table 64, and a per-command timing table 65. Configurations of the respective tables will be described later. The firmware memory 60 is an example of an update condition storage unit.

Next, a configuration related to transmission of data between the FM-CTL 30 and the FM chip 40 will be described.

Figure 3:
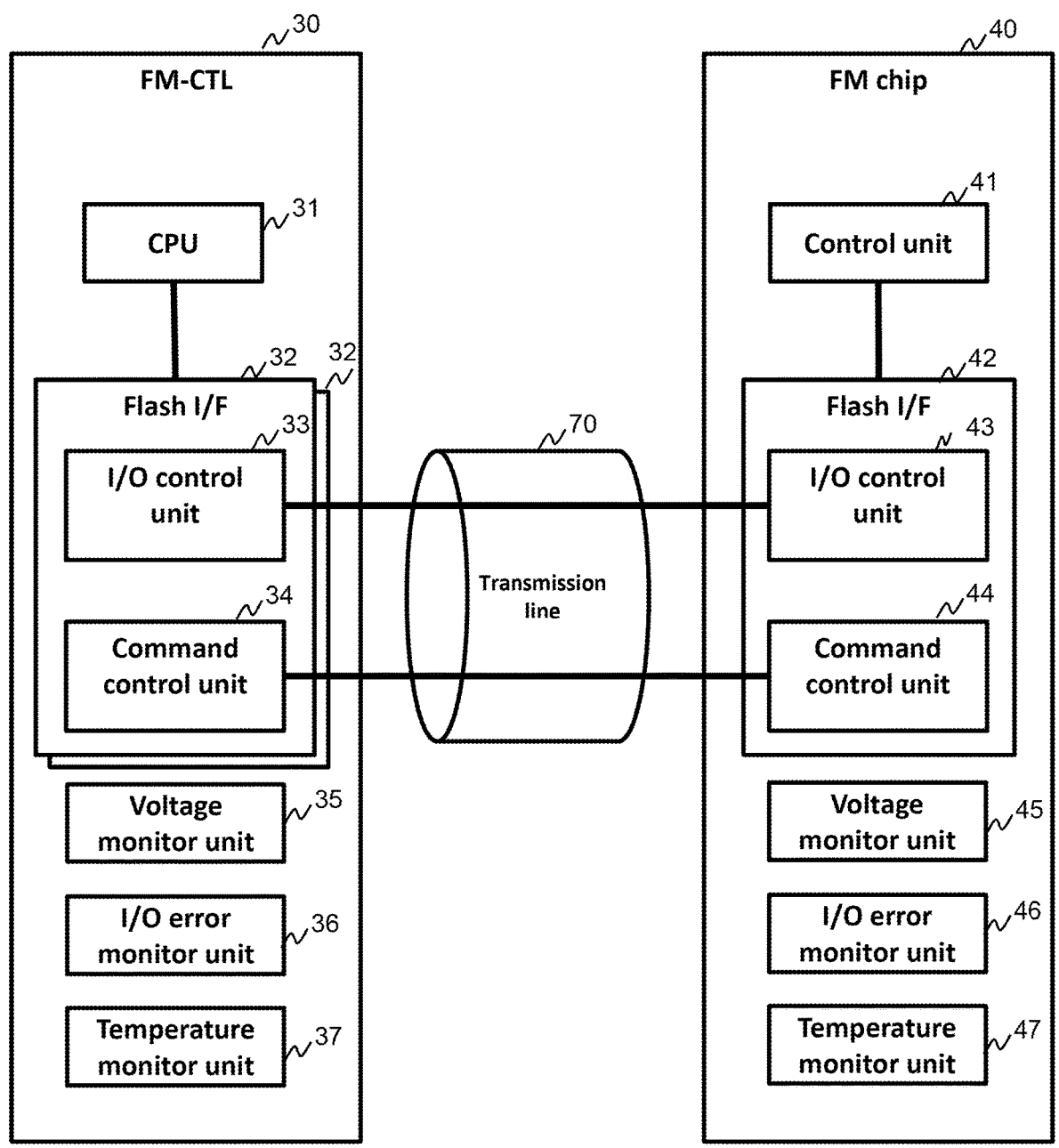
FIG. 3 is an explanatory diagram of a configuration related to transmission of data between an FM-CTL and an FM chip according to the embodiment.

FIG. 3 is an explanatory diagram of a configuration related to transmission of data between an FM-CTL and an FM chip according to the embodiment.

The FM-CTL 30 includes a CPU 31 as an example of a processor, one or more flash interfaces (Flash I/Fs) 32, a voltage monitor unit 35, an I/O error monitor unit 36, and a temperature monitor unit 37.

The CPU 31 executes various processes by executing a program stored in the main memory 50. The CPU 31 controls I/O processes of data to and from the FM chips 40. In addition, the CPU 31 executes a parameter update process of updating parameters of interfaces (the flash I/Fs 32 and 42) which execute communication between the FM-CTL 30 and the respective FM chips 40, and the like.

Each flash I/F 32 is provided in association with each channel in the transmission line 70 and includes an I/O control unit 33 and a command control unit 34. The I/O control unit 33 controls I/O processes of data to and from the plurality of FM chips 40 coupled to a corresponding channel. The command control unit 34 controls transmission and reception of commands to and from the FM chips 40 coupled to a corresponding channel.

The voltage monitor unit 35 measures voltage of a signal line between each flash I/F 32 and each FM chip 40 and notifies the CPU 31 of a measurement result. The I/O error monitor unit 36 monitors I/O errors with respect to data transmitted from the FM chip 40 and notifies the CPU 31 of a monitoring result. The I/O error monitor unit 36 may be a functional unit configured by an execution of a prescribed program by the CPU 31. The temperature monitor unit 37 detects a temperature of the FM-CTL 30, an intake temperature to the FMD 20, an exhaust temperature from the FMD 20, and the like and notifies the CPU 31 of a detection result. It should be noted that at least one of the voltage monitor unit 35, the I/O error monitor unit 36, and the temperature monitor unit 37 may be provided outside of the FM-CTL 30.

The FM chip 40 includes a control unit 41, a flash interface (a flash I/F) 42, a voltage monitor unit 45, an I/O error monitor unit 46, and a temperature monitor unit 47.

The control unit 41 executes various processes.

The flash I/F 42 includes an I/O control unit 43 and a command control unit 44. The I/O control unit 43 controls I/O processes of data to and from the flash I/F 32 of the FM-CTL 30. The command control unit 44 controls transmission and reception of commands to and from the FM-CTL 30.

The voltage monitor unit 45 measures voltage of a signal line between the FM-CTL 30 and each FM chip 40 and notifies the CPU 31 of the FM-CTL 30 of a measurement result. The I/O error monitor unit 46 monitors I/O errors with respect to data transmitted from the FM-CTL 30 and notifies the CPU 31 of the FM-CTL 30 of a monitoring result. The I/O error monitor unit 46 may be a functional unit configured by an execution of a prescribed program by the control unit 41. The temperature monitor unit 47 detects a temperature of the FM chip 40 and the like and notifies the CPU 31 of the FM-CTL 30 of a detection result. At least one of the voltage monitor unit 45, the I/O error monitor unit 46, and the temperature monitor unit 47 may be provided outside of the FM chip 40.

Next, a configuration related to a signal voltage of a transmission line between the FM-CTL 30 and the FM chip 40 will be described.

Figure 4:
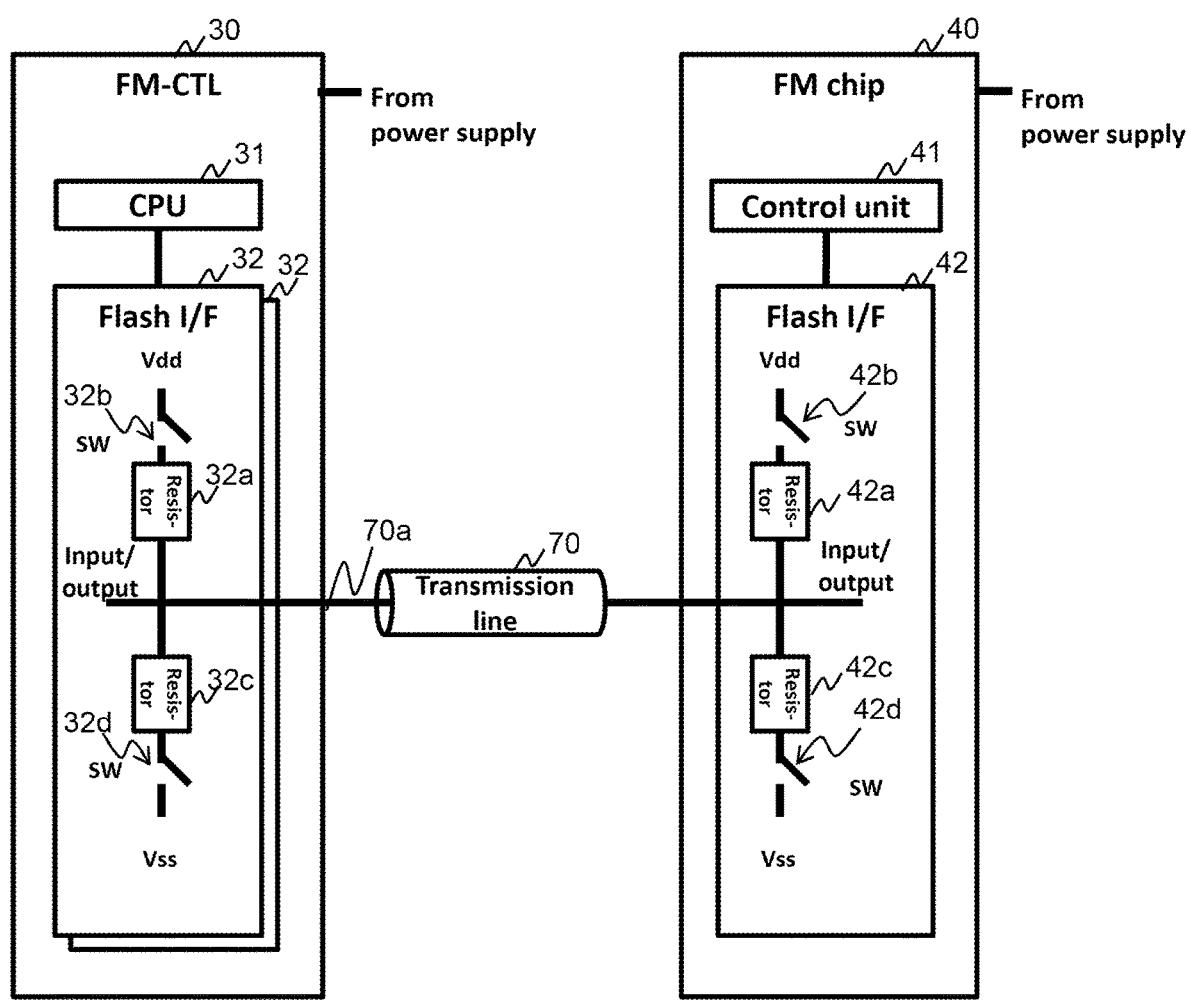
FIG. 4 is an explanatory diagram of a configuration related to a signal voltage of a transmission line between an FM-CTL and an FM chip according to the embodiment.

FIG. 4 is an explanatory diagram of a configuration related to a signal voltage of a transmission line between an FM-CTL and an FM chip according to the embodiment.

Power is supplied from a power supply (not illustrated) to the FM-CTL 30. In each flash I/F 32 of the FM-CTL 30, one or more pairs of a resistor 32*a* and a switch (SW) 32*b* are arranged between a signal line 70*a* and a positive-side power supply Vdd of the transmission line 70, and one or more pairs of a resistor 32*c* and a switch (SW) 32*d* are arranged between the signal line 70*a* and a negative-side power supply Vss of the transmission line 70. While FIG. 4 illustrates a configuration related to one signal line 70*a* of the transmission line 70, other signal lines of the transmission line 70 are configured in a similar manner.

In such a configuration, by controlling opening and closing of the switch 32*b* to control a resistance value between the signal line 70*a* and the positive-side power supply, the voltage (output voltage) of a signal when the signal is transmitted from the flash I/F 32 can be adjusted. In addition, by controlling opening and closing of the switch 32*d* to control a resistance value between the signal line 70*a* and the negative-side power supply, a terminal resistance value when receiving a signal from the flash I/F 42 of the FM chip 40 can be adjusted.

Power is supplied from a power supply (not illustrated) to the FM chip 40. In each flash I/F 42 of the FM chip 40, one or more pairs of a resistor 42*a* and a switch (SW) 42*b* are arranged between the signal line 70*a* and the positive-side power supply Vdd of the transmission line 70 and one or more pairs of a resistor 42*c* and a switch (SW) 42*d* are arranged between the signal line 70*a* and the negative-side power supply Vss of the transmission line 70.

In such a configuration, by controlling opening and closing of the switch 42*b* to control a resistance value between the signal line 70*a* and the positive-side power supply Vdd, the voltage (output voltage) of a signal when the signal is transmitted from the flash I/F 42 can be adjusted. In addition, by controlling opening and closing of the switch 42*d* to control a resistance value between the signal line 70*a* and the negative-side power supply Vss, a terminal resistance value when receiving a signal from the flash I/F 32 of the FM-CTL 30 can be adjusted.

While a value of resistors coupled to the signal line 70*a* are adjusted by controlling opening and closing of the switch 32*b*, the switch 32*d*, the switch 42*b*, the switch 42*d*, and the like in the configuration described above, for example, variable resistors may be provided in place of the pairs of a switch and a resistor.

Next, the various tables stored in the firmware memory 60 will be described.

FIG. 5 is a configuration diagram of an update condition table according to the embodiment.

The update condition table 61 manages entries corresponding to conditions (update conditions) under which a parameter update process of updating parameters of the flash I/Fs 32 and 42 are executed. An entry of the update condition table 61 includes fields of condition 61*a*, contents 61*b*, reference (previous value) 61*c*, and error 61*d*.

Condition 61*a* stores a name of a condition corresponding to the entry. Contents 61*b* stores contents of the condition corresponding to the entry. Reference (previous value) 61*c* stores a reference in the condition corresponding to the entry or a previous value (a value upon a previous execution of the parameter update process). Error 61*d* stores, when contents of the condition are inconsistent with a prescribed value, a range of error in which inconsistency is not determined.

In the update condition table 61, an entry 611 corresponds to a condition of a temperature change of the FM-CTL 30 and indicates that the parameter update process is executed when the temperature of the FM-CTL 30 is inconsistent with the previous value or, in other words, when the temperature of the FM-CTL 30 deviates from a range of ±0.5° C. (error) relative to the previous value (in the example shown in FIG. 5, 70° C.), an entry 612 corresponds to a condition of a temperature change of the intake temperature of the FMD 20 and indicates that the parameter update process is executed when the intake temperature of the FMD 20 is inconsistent with the previous value or, in other words, when the intake temperature of the FMD 20 deviates from a range of ±0.5° C. (error) relative to the previous value (in the example shown in FIG. 5, 25° C.), an entry 613 corresponds to a condition of a temperature change of the exhaust temperature of the FMD 20 and indicates that the parameter update process is executed when the exhaust temperature of the FMD 20 is inconsistent with the previous value or, in other words, when the exhaust temperature of the FMD 20 deviates from a range of ±0.5° C. (error) relative to the previous value (in the example shown in FIG. 5, 50° C.), and an entry 614 corresponds to a condition of a voltage change of the flash I/Fs and indicates that the parameter update process is executed when read voltage (voltage of a read signal) of the flash I/Fs 32 and 42 is inconsistent with the previous value or, in other words, when the read voltage of the flash I/Fs 32 and 42 deviates from a range of ±0.02 V (error) relative to the previous value (in the example shown in FIG. 5, 1.80 V).

In addition, an entry 615 corresponds to a condition of a temperature change of the FM chips 40 and indicates that the parameter update process is executed when an average temperature of the plurality of FM chips 40 is inconsistent with the previous value or, in other words, when the average temperature of the plurality of FM chips 40 deviates from a range of ±0.5° C. (error) relative to the previous value (in the example shown in FIG. 5, 30° C.), an entry 616 corresponds to a condition of I/O errors and indicates that the parameter update process is executed when the number of occurrences of I/O errors in I/O processes to and from the FM chips 40 is equal to or larger than a reference (in the example shown in FIG. 5, 5 times/hour), an entry 617 corresponds to a start time of the FMD 20 and indicates that the parameter update process is executed when an elapsed time from a previous parameter update process in the FMD 20 is equal to or longer than a reference (in the example shown in FIG. 5, 30 minutes), and an entry 618 corresponds to a condition of an initial start of the FMD 20 and indicates that the parameter update process is executed when it is the first start after the power supply of the FMD 20 had been turned on (the parameter update process has not yet been executed). The update conditions are not limited to the examples shown in FIG. 5 and other conditions may be adopted instead. For example, while the entry 615 represents an inconsistency between the average temperature of the plurality of FM chips 40 and a previous value thereof, the entry 615 may alternatively represent an inconsistency between a temperature of a specific FM chip 40 among the plurality of FM chips 40 and a previous value thereof or an inconsistency between a maximum temperature of the plurality of FM chips 40 and a previous value thereof.

Next, the voltage value table 62 will be described.

Figure 6:
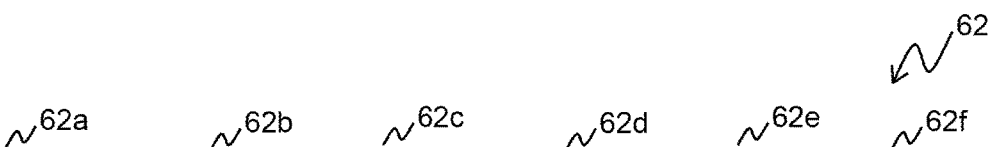
FIG. 6 is a configuration diagram of a voltage value table according to the embodiment.

FIG. 6 is a configuration diagram of a voltage value table according to the embodiment.

The voltage value table 62 stores entries related to voltage values of signals in the flash I/F. An entry of the voltage value table 62 includes parameter 62*a*, symbol 62*b*, minimum value (Min) 62*c*, reference value (Typ) 62*d*, maximum value (Max) 62*e*, and unit 62*f*.

Parameter 62*a* stores a type of a parameter of a voltage value corresponding to the entry. In the present embodiment, examples of parameters of a voltage value include a high-side (high potential-side) voltage of an input signal (input high voltage) and a low-side (low potential-side) voltage of an input signal (input low voltage). Symbol 62*b* stores a symbol indicating the parameter corresponding to the entry. Minimum value 62*c* stores a minimum value of a reference value of the parameter corresponding to the entry. Reference value 62*d* stores a reference value of the parameter corresponding to the entry. Maximum value 62*e* stores a maximum value of the reference value of the parameter corresponding to the entry. Unit 62*f* stores a unit of the parameter corresponding to the entry.

Next, the per-command timing table 65 will be described.

Figure 7:
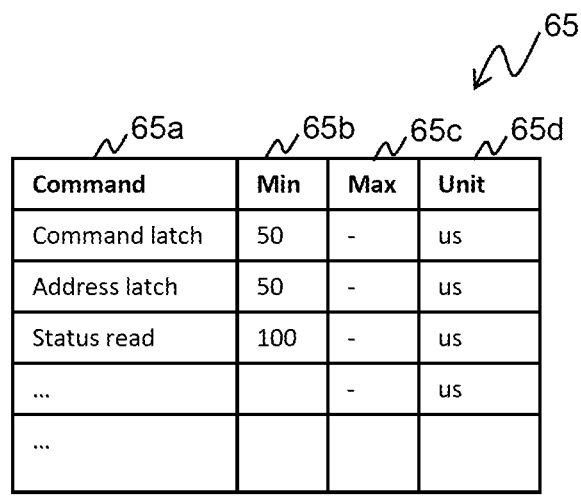
FIG. 7 is a configuration diagram of a per-command timing table according to the embodiment.

FIG. 7 is a configuration diagram of a per-command timing table according to the embodiment.

The per-command timing table 65 stores entries for each control command output by the flash I/F 32. An entry of the per-command timing table 65 includes the fields of command 65*a*, minimum value (Min) 65*b*, maximum value (Max) 65*c*, and unit 65*d*. Command 65*a* stores a name of a control command. Minimum value 65*b* stores a minimum value (in the example shown in FIG. 7, a shortest time) necessary as the control command corresponding to the entry. Maximum value 65*c* stores a maximum value as the control command corresponding to the entry. Unit 65*d* stores a unit of minimum value 65*b* and maximum value 65*c* of the control command corresponding to the entry.

A signal of a control command will now be described.

Figure 8:
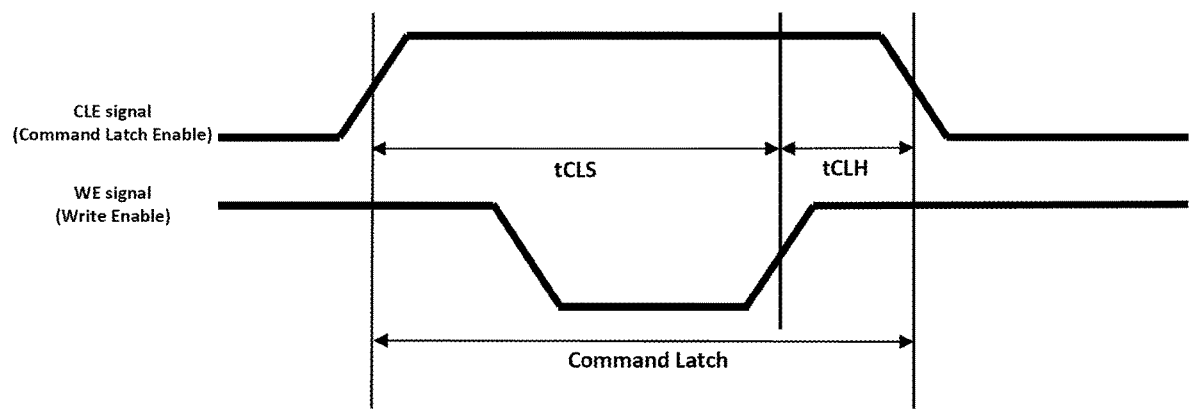
FIG. 8 is a diagram showing signal configurations and timings of control commands according to the embodiment.

FIG. 8 is a diagram showing signal configurations and timings of control commands according to the embodiment. FIG. 8 shows Command Latch among control commands as an example.

Command latch is expressed by a CLE (Command Latch Enable) signal and a WE (Write Enable) signal. Command latch is constituted by a time (tCLS: CLE Setup Time) to setup the CLE signal and a time (tCLH: CLE Hold Time) to hold the CLE signal. The time required by command latch is a sum of tCLS and tCLH.

Next, the configuration value table 63 will be described.

Figure 9:
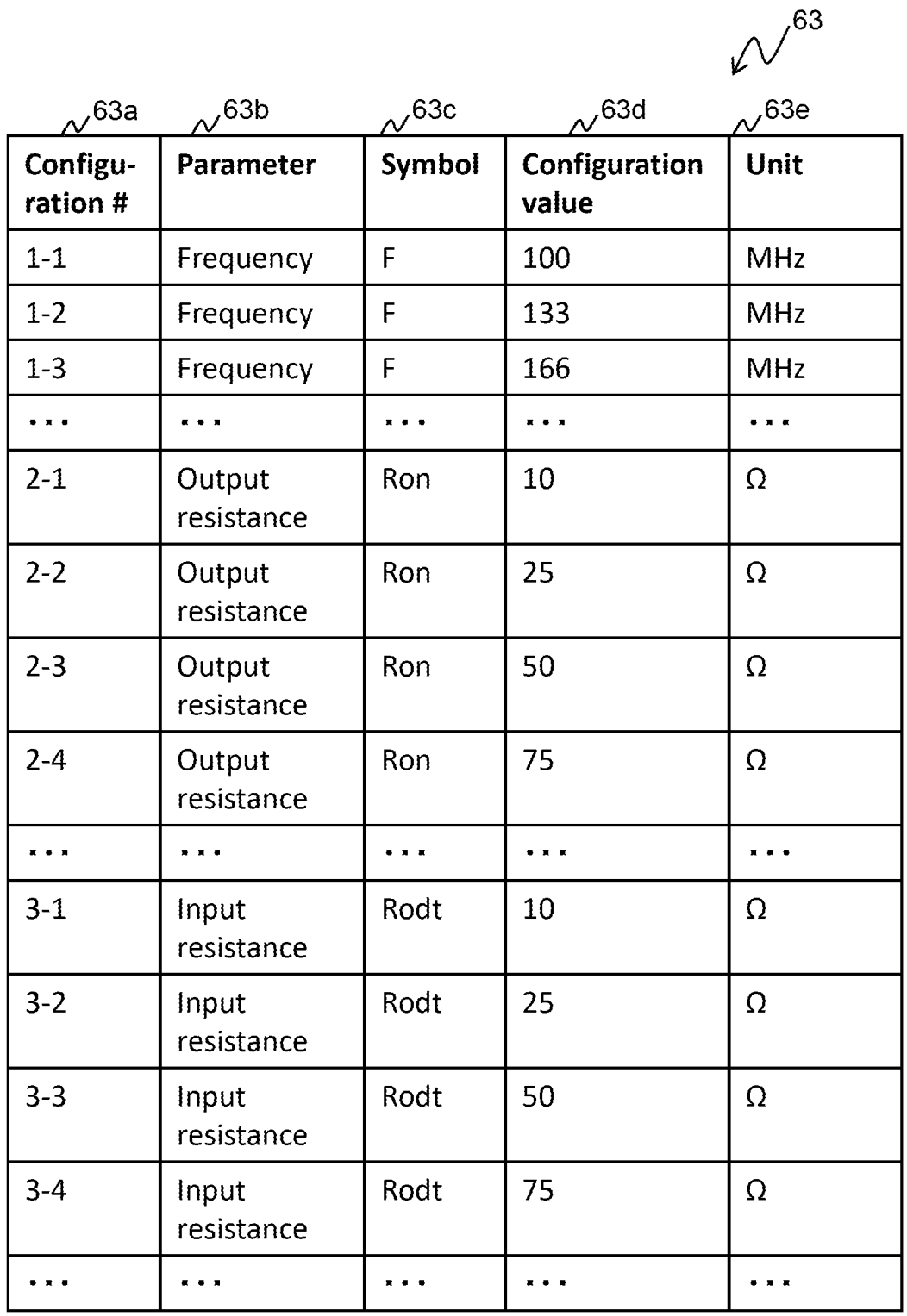
FIG. 9 is a configuration diagram of a configuration value table according to the embodiment.

FIG. 9 is a configuration diagram of a configuration value table according to the embodiment.

The configuration value table 63 is a table for managing configurations with respect to various parameters that are configurable in the flash I/Fs 32. A separate configuration value table 63 may be provided with respect to each of the flash I/Fs 32 or a single shared configuration value table 63 may be provided. In the present embodiment, a configuration value table similar to the configuration value table 63 with respect to the flash I/F 42 of each FM chip 40 is stored in a memory, a register, or the like in the FM chip 40.

An entry of the configuration value table 63 includes fields of configuration number (configuration #) 63*a*, parameter 63*b*, symbol 63*c*, configuration value 63*d*, and unit 63*e*.

Configuration number 63*a* stores a number (a configuration number) indicating a configuration corresponding to the entry. Parameter 63*b* stores a name of a type of a parameter corresponding to the entry. Types of parameters include a "frequency" indicating an operating frequency (which corresponds to a transfer rate and which is an example of transfer rate information) of the flash I/F 32, an "output resistance" indicating a resistance value on a side of a positive potential Vdd when performing output (transmission), and an "input resistance" indicating a resistance value on a side of a negative potential Vss when performing input (reception). Symbol 63*c* stores a symbol indicating the parameter corresponding to the entry. In symbol 63*c*, "F" is configured when the parameter type is "frequency", "Ron" is configured when the parameter type is "output resistance", and "Rodt" is configured when the parameter type is "input resistance". Configuration value 63*d* stores a configuration value of the parameter in the configuration corresponding to the entry. Unit 63*e* stores a unit of the configuration value in configuration value 63*d* corresponding to the entry. As the unit to be stored in unit 63*e*, for example, "MHz" is configured when the entry corresponds to frequency, and "Q" is configured when the entry corresponds to output resistance or input resistance.

Next, the configuration management table 64 will be described.

Figure 10:
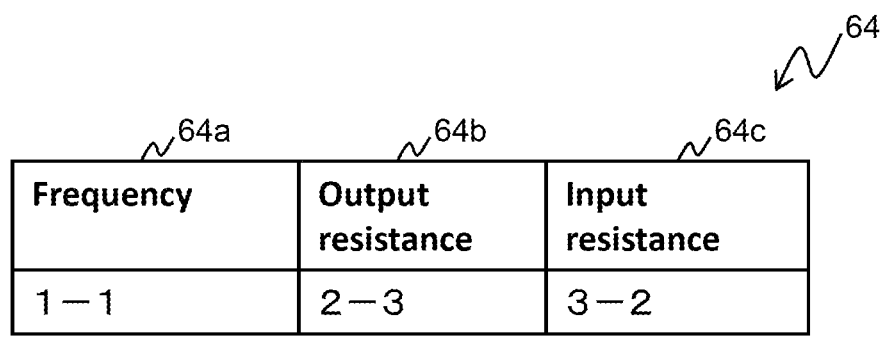
FIG. 10 is a configuration diagram of a configuration management table according to the embodiment.

FIG. 10 is a configuration diagram of a configuration management table according to the embodiment.

The configuration management table 64 is a table for managing current configurations of the parameters of the flash I/Fs 32. At least one configuration management table 64 is provided for each flash I/F 32. For example, with respect to each flash I/F 32, the configuration management table 64 may be provided for each FM chip 40 to be an I/O target. In other words, different parameter configurations can be made manageable for each FM chip 40 to be an I/O target.

An entry of the configuration management table 64 includes fields of frequency 64*a*, output resistance 64*b*, and input resistance 64*c*. Frequency 64*a* stores the configuration number of an entry of the configuration value table 63 storing a configuration value to be configured as an operating frequency of the flash I/F 32. Since an operating frequency and a transfer rate correspond to each other, the configuration value of the operating frequency can be considered a configuration value of the transfer rate. Output resistance 64*b* stores the configuration number of an entry of the configuration value table 63 storing a configuration value to be configured as an output resistance of the flash I/F 32. Input resistance 64c stores the configuration number of an entry of the configuration value table 63 storing a configuration value to be configured as an input resistance of the flash I/F 32.

In each FM chip 40, a configuration management table with a similar structure to the configuration management table 64 which manages current configurations of the parameters of the flash I/F 42 are stored in a memory or a register.

Next, processing operations of the computer system 1 according to the present embodiment will be described.

First, the parameter update process will be described.

Figure 11:
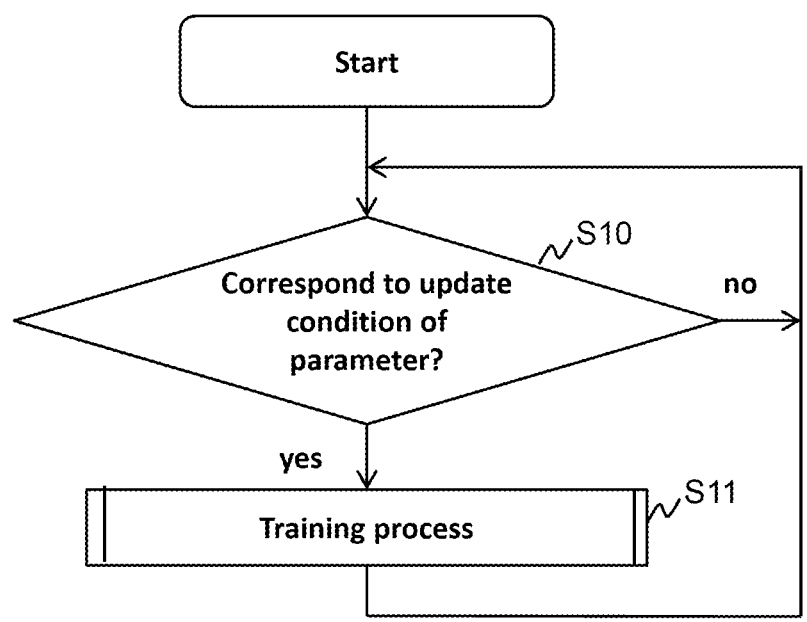
FIG. 11 is a flow chart of a parameter update process according to the embodiment.

FIG. 11 is a flow chart of the parameter update process according to the embodiment.

For example, the parameter update process is executed immediately after starting up the FMD 20. First, the CPU 31 of the FM-CTL 30 refers to the update condition table 61 and determines whether or not a current state corresponds to an update condition of a parameter (step S10). As a result, when the current state corresponds to the update condition (S10: yes), the CPU 31 executes a training process (refer to FIG. 12) (step S11) and advances processing to step S10. On the contrary, when the current state does not correspond to the update condition (S10: no), the CPU 31 advances processing to step S10. According to the parameter update process, when the current state corresponds to update conditions managed in the update condition table 61, the training process is appropriately executed and various parameters used by the flash I/Fs 32 and 42 of the FM-CTL 30 and the FM chip 40 can be configured to appropriate values.

Next, the training process (S11) will be described in detail.

Figure 12:
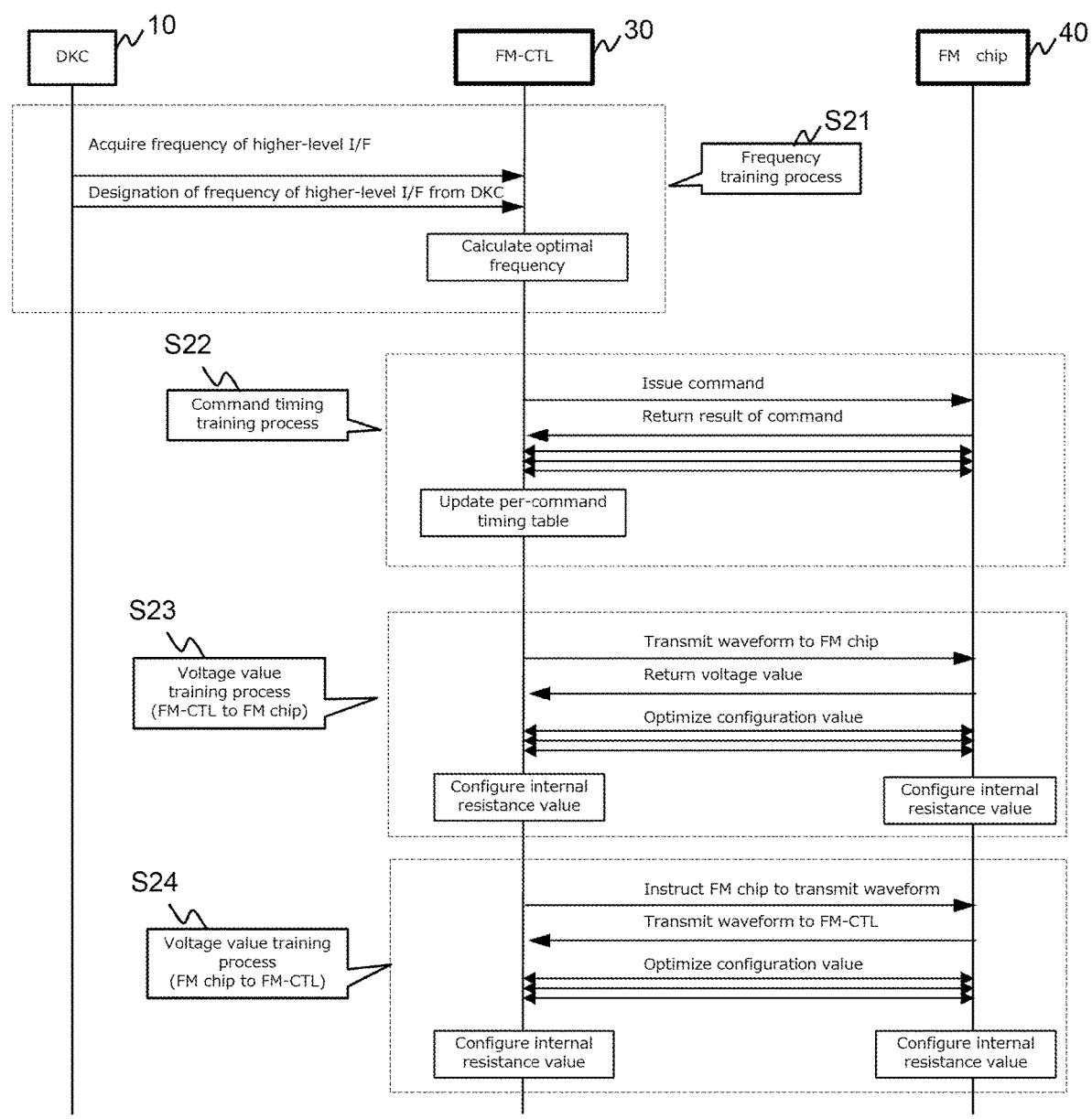
FIG. 12 is a sequence diagram of a training process according to the embodiment.

FIG. 12 is a sequence diagram of the training process according to the embodiment.

In the training process, the CPU 31 of the FM-CTL 30 first executes a frequency training process (refer to FIG. 13) of determining a frequency (corresponding to a transfer rate) in the FM-CTL 30 and in each channel between the FM-CTL 30 and the FM chips 40 (S21).

Next, the CPU 31 executes a command timing training process (refer to FIG. 14) of determining timings of control commands in the flash I/Fs of the FM-CTL 30 and the respective FM chips 40 (S22).

Next, the CPU 31 executes a voltage value training process (refer to FIG. 15) related to transmission from the FM-CTL 30 to the FM chips 40 in the flash I/Fs 32 and 42 of the FM-CTL 30 and the respective FM chips 40 (S23).

Next, the CPU 31 executes a voltage value training process (refer to FIG. 16) related to transmission from the FM chips 40 to the FM-CTL 30 in the flash I/Fs 32 and 42 of the respective FM chips 40 and the FM-CTL 30 (S24), and ends the training process.

According to the training process, the frequency in each channel between the FM-CTL 30 and the FM chips 40, timings of control commands, a voltage value related to transmission from the FM-CTL 30 to the FM chips 40, and a voltage value related to transmission from the FM chips 40 to the FM-CTL 30 can be configured to appropriate values.

Next, the frequency training process (S21) will be described.

Figure 13:
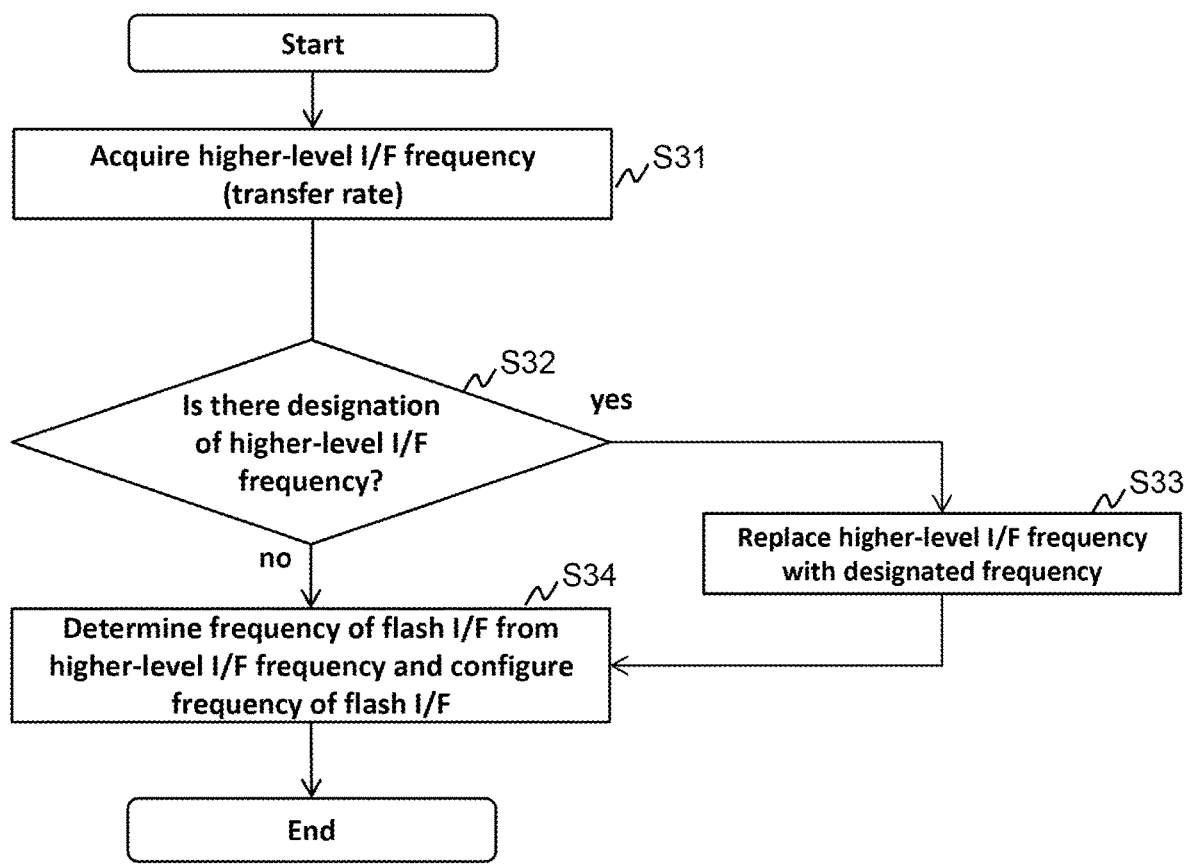
FIG. 13 is a flow chart of a frequency training process according to the embodiment.

FIG. 13 is a flow chart of the frequency training process according to the embodiment.

The CPU 31 of the FM-CTL 30 acquires an operating frequency (a transfer rate: a higher-level I/F frequency: higher-level transfer rate information) in a higher-level I/F (in other words, an interface with the DKC 10) (S31). At this point, as a method of acquiring the higher-level I/F frequency, the CPU 31 may make an inquiry to the DKC 10 to acquire the higher-level I/F frequency or the CPU 31 may acquire a higher-level I/F frequency configured in the FM-CTL 30 by the DKC 10.

Next, the CPU 31 determines whether or not there is a designation of a new higher-level I/F frequency from the DKC 10 (for example, a designation of a higher-level I/F frequency based on an input by a manager with respect to the DKC 10) (S32). As a result, when there is a designation of a higher-level I/F frequency (S32: yes), the CPU 31 performs a configuration for replacing the higher-level I/F frequency in the FM-CTL 30 with the DKC 10 with the designated frequency (S33).

When there is no designation of a higher-level I/F frequency (S32: no) or when the higher-level I/F frequency has been changed to the frequency designated in step S33, based on the higher-level I/F frequency, the CPU 31 determines an operating frequency of each of the flash I/Fs 32 and 42 and registers the operating frequency in the configuration management table 64 and, configures each of the flash I/Fs 32 and 42 to operate at the determined operating frequency (S34). The CPU 31 refers to an entry (an entry of which parameter 63b is "frequency") in the configuration value table 63 to specify operating frequencies (transfer rate information) at which the flash I/F 32 (or 42) is operable and determines the operating frequency from the frequencies.

In the determination of the operating frequency, specifically, the CPU 31 determines the operating frequency (the transfer rate information) of the flash I/F 32 so that a total value (a total transfer rate) of transfer rates based on operating frequencies of the plurality of flash I/Fs 32 for the respective channels of the transmission line (FM-BUS) 70 equals a transfer rate (a higher-level transfer rate) based on the higher-level I/F frequency or approximates the higher-level transfer rate.

More specifically, for example, the CPU 31 determines the operating frequency of the flash I/F 32 so that the following expression (1) is satisfied and the total transfer rate of the plurality of flash I/Fs 32 for the respective channels is maximized. Expression (1) represents an example that adopts the operating frequencies of the respective flash I/Fs 32 being equalized as a condition. Alternatively, the operating frequencies of the respective flash I/Fs 32 being equalized need not be adopted as a condition, in which case a right side of expression (1) represents a total transfer rate of the plurality of flash I/Fs 32 coupled to the plurality of channels.

$$X(\text{Mbps}) \geq Y(\text{Mbps}) * n \tag{1}$$

In expression (1), X denotes a transfer rate (a higher-level transfer rate) corresponding to the higher-level I/F frequency, Y denotes a transfer rate corresponding to the operating frequency of one flash I/F 32 or 42, and n denotes the number of channels in the transmission line 70 or, in other words, a maximum number of the FM chips 40 with respect to which the FM-CTL 30 is capable of executing I/O processes in parallel.

According to the frequency training process described above, the operating frequency of each flash I/F 32 can be configured to an appropriate value based on the higher-level I/F frequency or, in other words, a frequency at which data can be efficiently transferred.

Next, the command timing training process (S22) will be described.

Figure 14:
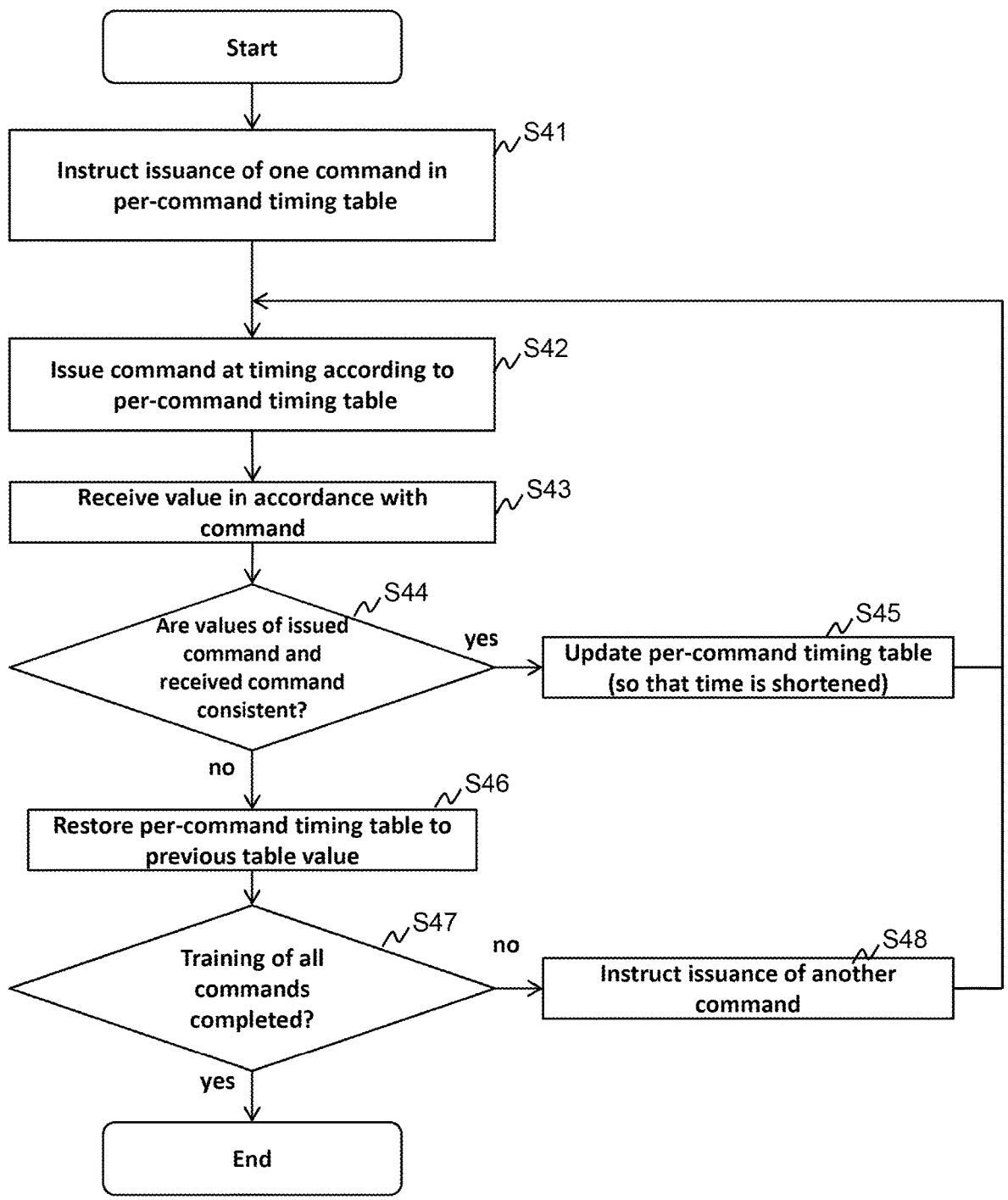
FIG. 14 is a flow chart of a command timing training process according to the embodiment.

FIG. 14 is a flow chart of the command timing training process according to the embodiment. The command timing training process is executed for each flash I/F 32 in charge of each channel of the transmission line 70 with, as a target, a command timing with respect to at least one FM chip 40 coupled to the channel of which the flash I/F 32 is in charge. When only a command timing with respect to a part of the FM chips 40 of a channel is to be trained, the command timing obtained by the training may be adopted as the command timing with respect to the other FM chips 40 coupled to the same channel.

The CPU 31 of the FM-CTL 30 instructs the flash I/F 32 that is a processing target to issue one command (control command) in the per-command timing table 65 to the flash I/F 42 of the FM chip 40 coupled to a channel of which the flash I/F 32 is in charge (S41).

Next, the flash I/F 32 having received the instruction issues the designated command to the flash I/F 42 of the FM chip 40 in accordance with a timing (for example, a minimum value (a shortest time) of the command) in an entry corresponding to the designated command in the per-command timing table 65 (S42). In response thereto, the flash I/F 42 of the FM chip 40 returns a value in accordance with a command recognized by the flash I/F 42 to the flash I/F 32 that is an issuance source.

Next, the flash I/F 32 receives the value in accordance with the command having been returned from the flash I/F 42 that is an issuance destination of the command (S43), and the CPU 31 determines whether or not values of the issued command and the received command are consistent (S44).

As a result, when the CPU 31 determines that the values of the issued command and the received command are consistent (S44: yes), since this means that the command can be appropriately transmitted at this timing, the CPU 31 updates a timing of an entry corresponding to the designated command in the per-command timing table 65 to a shorter time (so that, for example, the timing is shortened by a prescribed time) (S45) and advances the processing to step S42. The CPU 31 is to temporarily hold a value of the timing prior to update in the main memory 50 or the like.

On the contrary, as a result, when the CPU 31 determines that the values of the issued command and the received command are not consistent (S44: no), since this means that the command cannot be appropriately transmitted at this timing, the CPU 31 restores the timing of the entry corresponding to the designated command in the per-command timing table 65 to a previous value (in other words, the value temporarily held in the main memory 50 or the like) (S46) and advances the processing to step S47.

In step S47, the CPU 31 determines whether or not training (S42 to S46) has been completed with respect to all of the commands in the per-command timing table 65 as targets. As a result, when the training has not been completed with respect to all of the commands (S47: no), the CPU 31 instructs the flash I/F 32 that is the processing target to issue another command for which training has not been performed (S48) and advances the processing to step S42. On the contrary, when the training has been completed with respect to all of the commands (S47: yes), the CPU 31 ends the command timing training process with respect to the flash I/F 32 that is the processing target.

The command timing training process described above may be executed with respect to all of the FM chips 40 coupled to each channel of the transmission line 70. In this case, the per-command timing table 65 may be stored in correspondence with each of the FM chips 40 or, based on command timings with respect to all of the FM chips 40, a command timing (for example, an average value of a plurality of command timings) to be commonly used in same channels may be determined and the determined command timing may be configured to the per-command timing table 65.

According to the command timing training process described above, an appropriate timing when issuing a command between each of the flash I/Fs 32 and the flash I/F 42 can be specified and configured.

Next, the voltage value training process (S23) related to transmission from the FM-CTL 30 to the FM chip 40 will be described.

Figure 15:
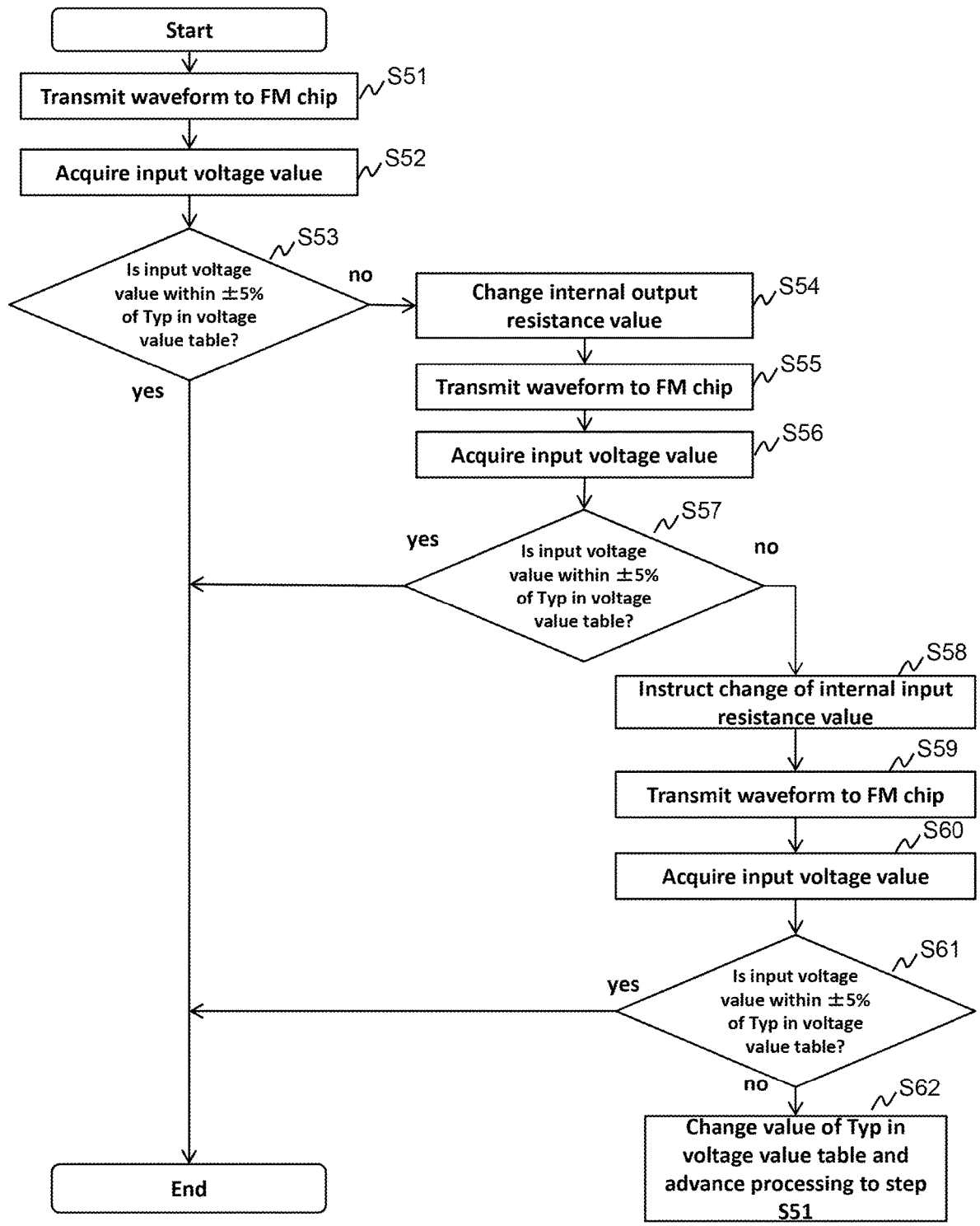
FIG. 15 is a flow chart of a voltage value training process related to transmission from an FM-CTL to an FM chip according to the embodiment.

FIG. 15 is a flow chart of the voltage value training process related to transmission from an FM-CTL to an FM chip according to the embodiment.

The voltage value training process related to transmission from the FM-CTL 30 to the FM chip 40 is executed for each flash I/F 32 in charge of each channel of the transmission line 70 in order to configure a voltage value (specifically, in order to configure a resistance value to be used) upon transmission to at least one FM chip 40 coupled to the channel of which the flash I/F 32 is in charge. Alternatively, the voltage value training process may be executed with respect to all of the FM chips 40 coupled to the channel of which the flash I/F 32 is in charge. In addition, when the voltage value training process is executed with respect to a part of the FM chips 40 of a channel, the configuration of the voltage value obtained by the training may be adopted as the configuration of the voltage value upon transmission to the other FM chips 40 coupled to the same channel.

First, the CPU 31 transmits a prescribed waveform from the flash I/F 32 to the FM chip 40 (S51) and acquires a voltage value (an input voltage value) of the waveform input to the flash I/F 42 from the FM chip 40 (S52). The input voltage value can be acquired from the voltage monitor unit 45 of the FM chip 40.

Next, the CPU 31 determines whether or not a maximum voltage and a minimum voltage of the input voltage value are in appropriate states with respect to respective reference values (for example, within a range of ±5% relative to reference values) (S53). Specifically, with respect to a maximum potential, the CPU 31 determines whether or not parameter 62a in the voltage value table 62 is in an appropriate state with respect to the reference value of reference value 62d in an entry of input high potential voltage and, with respect to a minimum potential, the CPU 31 determines whether or not parameter 62a in the voltage value table 62 is in an appropriate state with respect to the reference value of reference value 62d in an entry of input low potential voltage.

As a result, when the CPU 31 determines that the maximum voltage and the minimum voltage of the input voltage value are in appropriate states with respect to respective reference values (S53: yes), since this means that the configuration of the resistance value at the time point is appropriate, the voltage value training process related to transmission from the FM-CTL 30 to the FM chip 40 is ended.

On the contrary, when the CPU 31 determines that the maximum voltage and the minimum voltage of the input voltage value are not in appropriate states with respect to respective reference values (S53: no), since this means that the configuration of the resistance value at the time point is not appropriate, the CPU 31 changes a resistance value (an internal output resistance value) on an output side (on a positive-side power supply Vdd side of the signal line) of the flash I/F 32 and registers a configuration number of the output resistance in the configuration management table 64 (S54). At this point, the CPU 31 changes the resistance value to a larger value when the maximum voltage value of the input voltage value is higher than the reference value but changes the resistance value to a smaller value when the maximum voltage value of the input voltage value is lower than the reference value. The internal output resistance value can be changed by changing opening and closing of the switch 32*b* of the flash I/F 32 or the like. When there are a plurality of candidates that can be changed as internal output resistance values, the processes of S54 to S57 may be executed with respect to each candidate as a target.

Next, the CPU 31 transmits a prescribed waveform from the flash I/F 32 to the FM chip 40 (S55) and acquires a voltage value (an input voltage value) of the waveform input to the flash I/F 42 from the FM chip 40 (S56).

Next, the CPU 31 determines whether or not the maximum voltage and the minimum voltage of the input voltage value are in appropriate states with respect to respective reference values (for example, within a range of ±5% relative to reference values) (S57), and when the CPU 31 determines that the maximum voltage and the minimum voltage of the input voltage value are in appropriate states with respect to respective reference values (S57: yes), since this means that the configuration of the resistance value at the time point is appropriate, the voltage value training process related to transmission from the FM-CTL 30 to the FM chip 40 is ended.

On the contrary, when the CPU 31 determines that the maximum voltage and the minimum voltage of the input voltage value are not in appropriate states with respect to the respective reference values (S57: no), since this means that the configuration of the resistance value at the time point is not appropriate, the CPU 31 transmits an instruction to the FM chip 40 to change a resistance value (an internal input resistance value) on an input side (on a negative-side power supply Vss side of the signal line) of the flash I/F 42 (S58). At this point, the CPU 31 issues an instruction to change the resistance value to a larger value when the minimum voltage value of the input voltage value is higher than the reference value but to change the resistance value to a smaller value when the minimum voltage value of the input voltage value is lower than the reference value. When there are a plurality of candidates that can be changed as internal input resistance values, the processes of S58 to S61 may be executed with respect to each candidate as a target. When the FM chip 40 receives the change instruction to change the resistance value, the FM chip 40 changes the internal input resistance value by changing opening and closing of the switch 42*d* of the flash I/F 42 or the like and registers a configuration number of the input resistance in the configuration management table in the FM chip 40.

Next, the CPU 31 transmits a prescribed waveform from the flash I/F 32 to the FM chip 40 (S59) and acquires a voltage value (an input voltage value) of the waveform input to the flash I/F 42 from the FM chip 40 (S60).

Next, the CPU 31 determines whether or not the maximum voltage and the minimum voltage of the input voltage value are in appropriate states with respect to respective reference values (for example, within a range of ±5% relative to reference values) (S61), and when the CPU 31 determines that the maximum voltage and the minimum voltage of the input voltage value are in appropriate states with respect to respective reference values (S61: yes), since this means that the configuration of the resistance value at the time point is appropriate, the voltage value training process related to transmission from the FM-CTL 30 to the FM chip 40 is ended.

On the contrary, when the CPU 31 determines that the maximum voltage and the minimum voltage of the input voltage value are not in appropriate states with respect to respective reference values (S61: no), since this means that the configuration of the resistance value at the time point is not appropriate, the CPU 31 changes the reference values related to the input voltage value in the voltage value table 62 within ranges of the maximum value and the minimum value of the reference values and advances the processing to step S51 (S62).

According to the voltage value training process related to transmission from an FM-CTL to an FM chip described above, a voltage value of a signal when transmitting the signal from the FM-CTL 30 to the FM chip 40 can be configured to an appropriate value.

Next, the voltage value training process (S24) related to transmission from an FM chip to an FM-CTL will be described.

Figure 16:
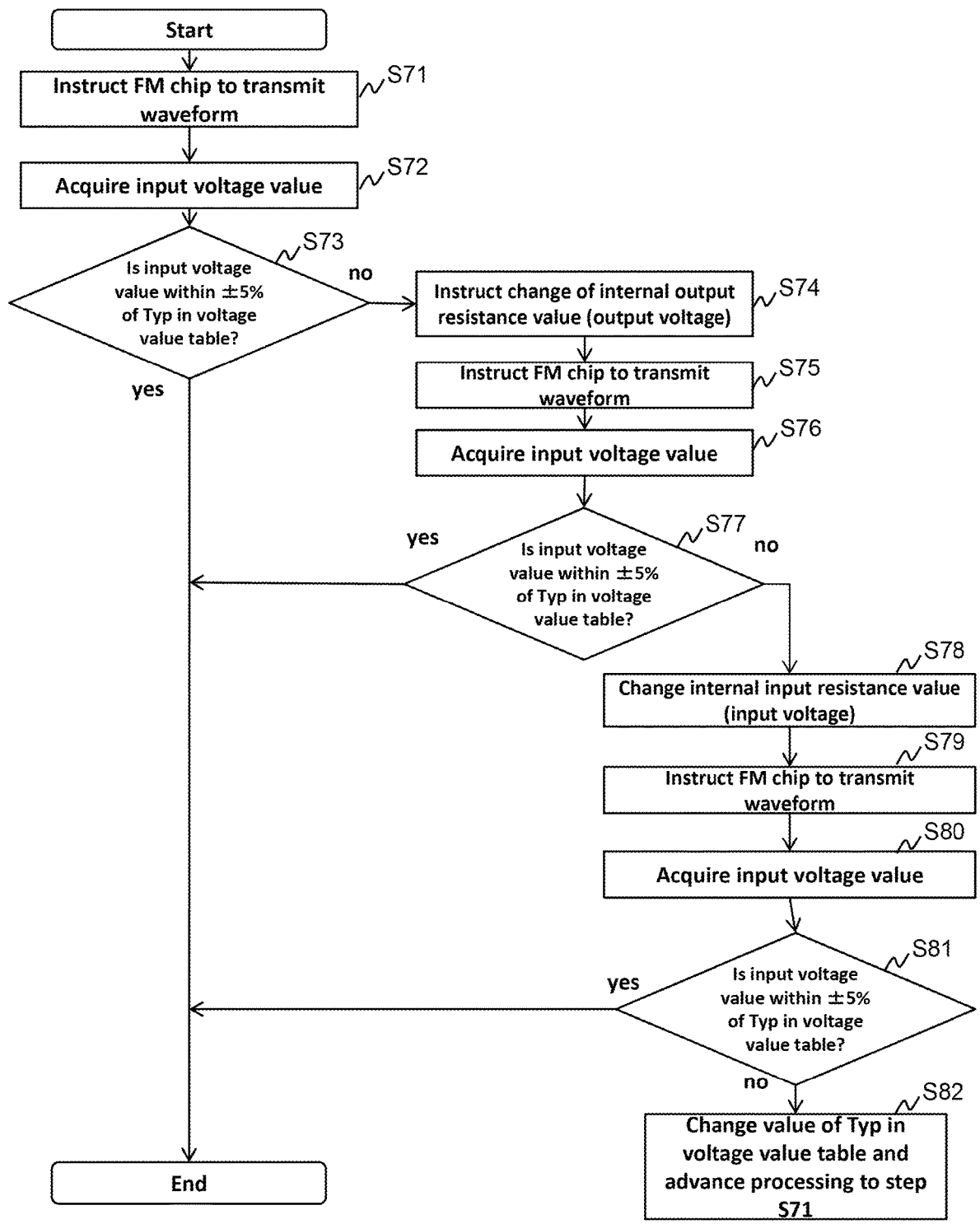
FIG. 16 is a flow chart of a voltage value training process related to transmission from an FM chip to an FM-CTL according to the embodiment.

FIG. 16 is a flow chart of a voltage value training process related to transmission from an FM chip to an FM-CTL according to the embodiment.

The voltage value training process related to transmission from the FM chip 40 to the FM-CTL 30 is executed for each flash I/F 32 in charge of each channel of the transmission line 70 in order to configure a voltage value (specifically, in order to configure a used resistance value) upon reception from at least one FM chip 40 coupled to the channel of which the flash I/F 32 is in charge. It should be noted that the voltage value training process may be executed with respect to all of the FM chips 40 coupled to the channel of which the flash I/F 32 is in charge. In addition, when the voltage value training process is executed with respect to a part of the FM chips 40 of a channel, the configuration of the voltage value obtained by the training may be adopted as the configuration of the voltage value upon reception from the other FM chips 40 coupled to the same channel.

First, the CPU 31 issues an instruction to the FM chip 40 to transmit a prescribed waveform to the FM-CTL 30 (S71). The FM chip 40 having received the instruction is to transmit the prescribed waveform from the flash I/F 42. The CPU 31 acquires, from the voltage monitor unit 35, a voltage value (an input voltage value) of the waveform input to the flash I/F 32 from the flash I/F 42 (S72).

Next, the CPU 31 determines whether or not a maximum voltage and a minimum voltage of the input voltage value are in appropriate states with respect to respective reference values (for example, within a range of ±5% relative to reference values) (S73). Specifically, with respect to a maximum potential, the CPU 31 determines whether or not parameter 62*a* in the voltage value table 62 is in an appropriate state with respect to the reference value of reference value 62*d* in an entry of input high potential voltage and, with respect to a minimum potential, the CPU 31 determines whether or not parameter 62*a* in the voltage value table 62 is in an appropriate state with respect to the reference value of reference value 62*d* in an entry of input low potential voltage.

As a result, when the CPU 31 determines that the maximum voltage and the minimum voltage of the input voltage value are in appropriate states with respect to respective reference values (S73: yes), since this means that the configuration of the resistance value at the time point is appropriate, the voltage value training process related to transmission from the FM chip 40 to the FM-CTL 30 is ended.

On the contrary, when the CPU 31 determines that the maximum voltage and the minimum voltage of the input voltage value are not in appropriate states with respect to the respective reference values (S73: no), since this means that the configuration of the resistance value at the time point is not appropriate, the CPU 31 transmits an instruction to the FM chip 40 to change a resistance value (an internal output resistance value) on an output side (on a positive-side power supply Vdd side of the signal line 70*a*) of the flash I/F 42 (S74). At this point, the CPU 31 issues an instruction to change the resistance value to a larger value when the maximum voltage value of the input voltage value is higher than the reference value but to change the resistance value to a smaller value when the maximum voltage value of the input voltage value is lower than the reference value. When the FM chip 40 receives the change instruction to change the resistance value, the FM chip 40 changes the internal output resistance value by changing opening and closing of the switch 42*b* of the flash I/F 42 or the like and registers a configuration number of the output resistance in the configuration management table in the FM chip 40. When there are a plurality of candidates that can be changed as internal output resistance values, the processes of S74 to S77 may be executed with respect to each candidate as a target.

Next, the CPU 31 issues an instruction to the FM chip 40 to transmit a prescribed waveform to the FM-CTL 30 (S75). Next, the CPU 31 acquires, from the voltage monitor unit 35, a voltage value (an input voltage value) of the waveform input to the flash I/F 32 from the flash I/F 42 (S76).

Next, the CPU 31 determines whether or not the maximum voltage and the minimum voltage of the input voltage value are in appropriate states with respect to respective reference values (for example, within a range of ±5% relative to reference values) (S77), and when the CPU 31 determines that the maximum voltage and the minimum voltage of the input voltage value are in appropriate states with respect to respective reference values (S77: yes), since this means that the configuration of the resistance value at the time point is appropriate, the voltage value training process related to transmission from the FM chip 40 to the FM-CTL 30 is ended.

On the contrary, when the CPU 31 determines that the maximum voltage and the minimum voltage of the input voltage value are not in appropriate states with respect to respective reference values (S77: no), since this means that the configuration of the resistance value at the time point is not appropriate, the CPU 31 changes a resistance value (an internal input resistance value) on an input side (on a negative-side power supply Vss side of the signal line) of the flash I/F 32 and registers a configuration number of the input resistance in the configuration management table 64 (S78). At this point, the CPU 31 changes the resistance value to a larger value when the maximum voltage value of the input voltage value is higher than the reference value but changes the resistance value to a smaller value when the maximum voltage value of the input voltage value is lower than the reference value. The internal input resistance value can be changed by changing opening and closing of the switch 32*d* of the flash I/F 32 or the like.

Next, the CPU 31 issues an instruction to the FM chip 40 to transmit a prescribed waveform to the FM-CTL 30 (S79). Next, the CPU 31 acquires, from the voltage monitor unit 35, a voltage value (an input voltage value) of the waveform input to the flash I/F 32 from the flash I/F 42 (S80).

Next, the CPU 31 determines whether or not the maximum voltage and the minimum voltage of the input voltage value are in appropriate states with respect to respective reference values (for example, within a range of ±5% relative to reference values) (S81), and when the CPU 31 determines that the maximum voltage and the minimum voltage of the input voltage value are in appropriate states with respect to respective reference values (S81: yes), since this means that the configuration of the resistance value at the time point is appropriate, the voltage value training process related to transmission from the FM chip 40 to the FM-CTL 30 is ended.

On the contrary, when the CPU 31 determines that the maximum voltage and the minimum voltage of the input voltage value are not in appropriate states with respect to respective reference values (S81: no), since this means that the configuration of the resistance value at the time point is not appropriate, the CPU 31 changes the reference values related to the input voltage value in the voltage value table 62 within ranges of the maximum value and the minimum value of the reference values and advances the processing to step S71 (S82).

According to the voltage value training process related to transmission from an FM chip to an FM-CTL described above, a voltage value of a signal when transmitting the signal from the FM chip 40 to the FM-CTL 30 can be configured to an appropriate value.

Next, a computer system according to a modification will be described. In the following description, differences from the computer system 1 presented above will be described using reference signs of the computer system 1 for the sake of convenience.

The firmware memory 60 further stores a per-signal timing table 66.

Figure 17:
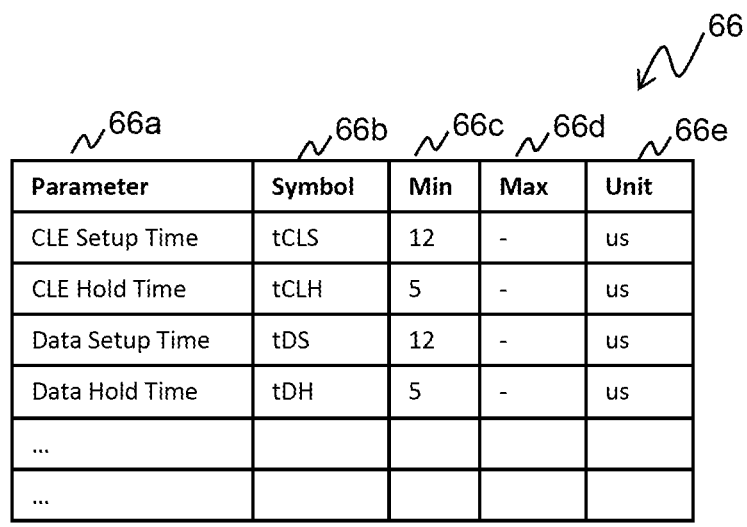
FIG. 17 is a configuration diagram of a per-signal timing table according to a modification.

FIG. 17 is a configuration diagram of the per-signal timing table according to the modification.

The per-signal timing table 66 is a table for managing one or more timings according to specifications of respective signals constituting a control command. The per-signal timing table 66 manages an entry for each timing of each signal constituting a control command. An entry of the per-signal timing table 66 includes fields of parameter 66*a*, symbol 66*b*, minimum value (Min) 66*c*, maximum value (Max) 66*d*, and unit 66*e*.

Parameter 66*a* stores a type of a timing of a signal corresponding to the entry. In the present embodiment, examples of types of timings of a signal include a setup time (CLE Setup Time) of a CLE signal and a hold time (CLE Hold Time) of a CLE signal. Symbol 66*b* stores a symbol indicating the parameter corresponding to the entry. Minimum value 66*c* stores a minimum value of the parameter corresponding to the entry. Maximum value 66*d* stores a maximum value of the parameter corresponding to the entry. Unit 66*e* stores a unit of the parameter corresponding to the entry. According to the first and second entries of the per-signal timing table 66, it is revealed that timings of a CLE signal constituting a command latch include a setup time of the CLE signal and a hold time of the CLE signal, a shortest time of the setup time of the CLE signal is 12 us (microseconds), and a shortest time of the hold time of the CLE signal is 5 us. As a result, it is revealed that a shortest time of the command latch is the time obtained as a sum of the shortest times of the setup time of the CLE signal and the hold time of the CLE signal or, in other words, 12+5=17 us.

With a command timing training process according to the modification, in the command timing training process shown in FIG. 14, when the values of the issued command and the received command are consistent (S44: yes), the CPU 31 refers to the per-signal timing table 66, specifies a shortest time of a signal required by the issued command, and advances the processing to step S47 when the current configuration is consistent with the shortest time, but when the current configuration is not consistent with the shortest time, the CPU 31 updates the timing in S45 so as to shorten the time of the command within a range in which the time of the command does not become shorter than the shortest time.

According to this modification, parameters can be optimized while ensuring that signals of a command do not become shorter than the shortest time according to specifications.

It is to be understood that the present invention is not limited to the embodiment described above and that various modifications can be made in the invention without departing from the spirit and scope thereof.

For example, although in the embodiment described above, when the input voltage value is not an appropriate value (no in S53, no in S73), a process of changing an output resistance value (S54 to S56, S74 to S76) is first executed, and when the input voltage value is still not an appropriate value (no in S57, no in S77), a process of changing an input resistance value (S58 to S60, S78 to S80) is executed, the present invention is not limited thereto and, for example, when the input voltage value is not an appropriate value, a process of changing an input resistance value may be first executed, and when the input voltage value is still not an appropriate value, a process of changing an output resistance value may be executed. In addition, when the input voltage value is not an appropriate value, only one of the process of changing an output resistance value and the process of changing an input resistance value may be executed. Furthermore, while the voltage value training process related to transmission from the FM-CTL to the FM chip is first executed and the voltage value training process related to transmission from the FM chip to the FM-CTL is next executed, the present invention is not limited thereto and the processes may be executed in a reverse order.

In addition, while a frequency between the FM-CTL 30 and the DKC 10 is used as a higher-level I/F frequency of the FM-CTL 30 in the embodiment described above, the present invention is not limited thereto and, for example, when temporarily storing data from the DKC 10 in the main memory 50 and subsequently reading the data from the main memory 50 and storing the data in the FM chip 40 (the main memory 50 is also an example of a higher-level apparatus) and an operating frequency of the main memory 50 is lower than a frequency between the DKC 10 and the FM-CTL 30 or, in other words, when a transfer rate between the FM-CTL 30 and the main memory 50 is lower than a transfer rate between the DKC 10 and the FM-CTL 30, the operating frequency of the main memory 50 may be used as the higher-level I/F frequency.

Furthermore, while a case in which the FMD 20 is provided in the storage system 3 or, in other words, a case in which the FMD 20 executes I/O processes to and from the DKC 10 is described as an example in the embodiment presented above, the present invention is not limited thereto and a configuration in which the FMD 20 is connected to a CPU via a PCIe bus may be adopted. In this case, the example of a higher-level apparatus of the FMD 20 is the CPU.

In addition, a part of or all of the processes performed by the CPU 31 of the FM-CTL 30 in the embodiment described above may be performed by a hardware circuit. Furthermore, the programs in the embodiment described above may be installed from a program source. The program source may be a program distribution server or a storage medium (for example, a portable storage medium).

What is claimed is:

1. A non-volatile memory device comprising a plurality of non-volatile memory chips and a non-volatile memory controller equipped with an interface for executing I/O processes of data to and from the non-volatile memory chips, wherein
   the non-volatile memory controller is coupled to the plurality of non-volatile memory chips via a plurality of channels and the interface is provided in correspondence to each of the plurality of the channels, and
   the non-volatile memory controller is configured to:
   acquire higher-level transfer rate information related to a data transfer rate between a higher-level apparatus and the non-volatile memory controller;
   determine transfer rate information related to a transfer rate of the interfaces such that a total transfer rate which is a sum of transfer rates to and from the non-volatile memory chips produced by the respective interfaces corresponding to the plurality of channels should be a transfer rate that equals a higher-level transfer rate corresponding to the higher-level transfer rate information or a transfer rate that approximates the higher-level transfer rate; and
   perform a configuration related to a transfer rate on the basis of the determined transfer rate information with respect to each of the interfaces.

2. The non-volatile memory device according to claim 1, wherein
   the non-volatile memory controller is configured to,
   when a transfer rate to and from the non-volatile memory chip by each of the interfaces corresponding to the plurality of channels is set to a same transfer rate, determine transfer rate information related to the transfer rate of the interface such that the total transfer rate to and from the non-volatile memory chip produced by the interfaces should be a transfer rate that equals a higher-level transfer rate corresponding to the higher-level transfer rate information or a transfer rate that approximates the higher-level transfer rate.

3. The non-volatile memory device according to claim 1, further comprising
   an update condition storage portion configured to store update conditions that are conditions under which an update of configurations related to the transfer rate of the interfaces are performed, wherein
   the non-volatile memory controller is configured to determine whether or not the update conditions are satisfied, and perform an update of configurations related to the transfer rate of the interfaces when the update conditions are satisfied.

4. The non-volatile memory device according to claim 3, wherein
   the update conditions include updating configurations related to the transfer rate is not performed after turning the non-volatile memory device on.

5. The non-volatile memory device according to claim 3, wherein
   the update conditions include that a prescribed time has lapsed from updating configurations related to the transfer rate of the interfaces.

6. The non-volatile memory device according to claim 1, wherein
   the non-volatile memory controller is configured to,
   for each of the interfaces, change timings at which commands are transmitted from the interface to the plurality of non-volatile memory chips and have a command actually transmitted, and determine a command timing to be configured to the interface on the basis of a communication status of the command.

7. The non-volatile memory device according to claim 6, wherein
the non-volatile memory controller is configured to,
for each of the interfaces, check a communication status of a command at the plurality of non-volatile memory chips while adjusting timings at which the command is transmitted from the interface to the plurality of non-volatile memory chips so as to gradually shorten the timings, and determine a shortest command timing at which the command can be recognized by the non-volatile memory chips as a command timing to be configured to the interface.

8. The non-volatile memory device according to claim 1, wherein
the non-volatile memory controller is configured to,
for each of the interfaces, change a voltage state of at least one of the interface and the plurality of non-volatile memory chips when transmitting a signal from the interface to the plurality of non-volatile memory chips and have a signal actually transmitted, and determine, on the basis of a communication status of the signal, a voltage state to be configured to the interface when transmitting a signal to the non-volatile memory chips.

9. The non-volatile memory device according to claim 1, wherein
the non-volatile memory controller is configured to,
for each of the interfaces, change a voltage state of at least one of the interface and the plurality of non-volatile memory chips coupled to the interface when receiving a signal from the plurality of non-volatile memory chips and have a signal actually received, and determine, based on a communication status of the signal, a voltage state to be configured to the interface when receiving a signal from each of the non-volatile memory chips.

10. An interface configuration method in a non-volatile memory device including a plurality of non-volatile memory chips and a non-volatile memory controller equipped with an interface for executing I/O processes of data to and from the non-volatile memory chips,
the non-volatile memory controller being coupled to the plurality of non-volatile memory chips via a plurality of channels and the interface being provided in correspondence to each of the plurality of the channels, the interface configuration method comprising:
acquiring higher-level transfer rate information related to a data transfer rate between a higher-level apparatus and the non-volatile memory controller;
determining transfer rate information related to a transfer rate of the interfaces such that a total transfer rate which is a sum of transfer rates to and from the non-volatile memory chips produced by the respective interfaces corresponding to the plurality of channels should be a transfer rate that equals a higher-level transfer rate corresponding to the higher-level transfer rate information or a transfer rate that approximates the higher-level transfer rate; and
performing a configuration related to a transfer rate on the basis of the determined transfer rate information with respect to each of the interfaces.

* * * * *